(12) United States Patent
Carberry (10) Patent No.: US 8,828,791 B2
(45) Date of Patent: Sep. 9, 2014

(54) SUBSTRATE FOR USE IN PREPARING SOLAR CELLS

(75) Inventor: John Carberry, Talbott, TN (US)

(73) Assignee: Mossey Creek Solar, LLC, Jefferson City, TN (US)

(*) Notice: Subject to any disclaimer, the term of this patent is extended or adjusted under 35 U.S.C. 154(b) by 223 days.

(21) Appl. No.: 13/554,227

(22) Filed: Jul. 20, 2012

(65) Prior Publication Data

US 2013/0023084 A1    Jan. 24, 2013

Related U.S. Application Data

(60) Provisional application No. 61/509,618, filed on Jul. 20, 2011.

(51) Int. Cl.
*H01L 21/00*    (2006.01)

(52) U.S. Cl.
USPC .......... 438/98; 264/104; 136/256; 423/326; 423/327.1

(58) Field of Classification Search
USPC .......... 438/98; 136/256; 264/104; 423/326; 423/327.1
See application file for complete search history.

(56) References Cited

U.S. PATENT DOCUMENTS

| | | | |
|---|---|---|---|
| 4,624,862 A | 11/1986 | Yang et al. | |
| 4,803,183 A | 2/1989 | Schwetz et al. | |
| 4,877,759 A | 10/1989 | Holt | |
| 4,908,173 A | 3/1990 | Schwetz et al. | |
| 5,049,367 A | 9/1991 | Nakano et al. | |
| 5,165,983 A | 11/1992 | Sugiura et al. | |
| 5,427,601 A | 6/1995 | Harada et al. | |
| 5,431,869 A | 7/1995 | Kumar et al. | |
| 5,496,416 A * | 3/1996 | Hall et al. | ............ 136/258 |
| 5,654,246 A | 8/1997 | Newkirk et al. | |
| 6,013,236 A | 1/2000 | Takahashi | |
| 6,902,699 B2 | 6/2005 | Fritzemeier et al. | |
| 7,344,675 B2 | 3/2008 | Van Daam et al. | |
| 7,354,490 B2 | 4/2008 | Fritzemeier et al. | |
| 7,604,696 B2 | 10/2009 | Carberry | |
| 7,922,841 B2 | 4/2011 | Bampton | |

(Continued)

FOREIGN PATENT DOCUMENTS

| | | |
|---|---|---|
| CN | 101244823 | 8/2008 |
| JP | 11-054805 | 2/1999 |

(Continued)

OTHER PUBLICATIONS

Joo-Hyoung Lee, Giulai A. Galli, and Jeffrey C. Grossman, Nanoporous Si as an Efficient Thermoelectric Material, NANO Letters 2008, vol. 8, No. 11 3750-3754, ACS Publications.

(Continued)

*Primary Examiner* — David Vu
(74) *Attorney, Agent, or Firm* — Pitts & Lake, P.C.

(57) ABSTRACT

Conductive material is combined with other substances to form a composite material for use as a conductive back face substrate for a thin silicon wafer solar cell. In at least one embodiment, a conductive composite substrate material is fabricated by filling granular conductive material with a mineral or ceramic or other small particulate with a low CTE; the composite is cast and fired so that it has an electrically conductive continuous phase and a discontinuous phase that will control and match the CTE of the substrate to be equal to or close to that of silicon, thereby diminishing the effects of bowing from CTE-mismatch.

20 Claims, 4 Drawing Sheets

(56) References Cited

U.S. PATENT DOCUMENTS

| | | | |
|---|---|---|---|
| 2002/0125402 | A1 | 9/2002 | Cordes et al. |
| 2004/0048411 | A1 | 3/2004 | Nishida |
| 2005/0145176 | A1 | 7/2005 | Wicker |
| 2006/0142143 | A1 | 6/2006 | Abrevaya et al. |
| 2008/0153688 | A1 | 6/2008 | Borens et al. |
| 2008/0233720 | A1 | 9/2008 | Carberry |
| 2009/0120493 | A1 | 5/2009 | Sinha |
| 2009/0191112 | A1 | 7/2009 | Moon et al. |
| 2009/0250103 | A1 | 10/2009 | Katoh et al. |
| 2010/0059107 | A1 | 3/2010 | Barnett et al. |
| 2010/0084776 | A1 | 4/2010 | Murozono et al. |

FOREIGN PATENT DOCUMENTS

| | | |
|---|---|---|
| WO | WO2004055909 | 7/2004 |
| WO | WO2006107769 | 10/2006 |
| WO | WO 2010/092972 A1 | 8/2010 |
| WO | WO 2012/033303 A2 | 3/2012 |
| WO | WO 2012/067327 A1 | 5/2012 |

OTHER PUBLICATIONS

Tadashi Ishida, Kuniyuki Kakushima, Naruo Sasaki and Hiroyuki Fujita, In situ TEM observation of nanobonding formation between silicon MEMS tips, IOP Publishing Letters Ltd (http://iopscience.iop.org/0957-4484/21/43/435705).

D. Wagner, Point Defects in Crystalline and Amorphous Silicon, Journal of Optoelectronics and Advanced Materials, vol. 6, No. 1, Mar. 2004, p. 345-347.

Pengliang Ci, Jing Shi, Fei Wang, Shaohui Xu, Zhenya Yang,Pingxiong Yang, Lianwei Wang, Paul K. Chu, Novel thermoelectric materials based on boron-doped silicon microchannel plates, Elsevier Materials Letters 62(2011)1618-1620.

Faiz Salleh, Kiyosumi Asai, Akihiro Ishida, and Hiroya Ikeda,Seebeck Coefficient of Ultrathin Silicon-on-Insulator Layers, 2009 The Japan Society of Applied Physics, Appl. Phys. Express 2 (2009) 071203, 071203-1-071203-3.

PL Ci, J Shi, F Wang, L Sun, S H Xu, PX Yang, L W Wang and Paul L Chu, Thermoelectric Properties of Silicon Microchannel Plates Structures, IOP Publishing, 3rd International Photonics & OptoElectronics Meetings (POEM 2010, Journal of Physics: Conference Series 276 (2011) 012043 (http://iopscience.iop.org/1742-6596/276/1-012043).

Moran Wang, Ning Pan, Modeling and prediction of the effective thermal conductivity of random open-cell porous foams, Elsevier, International Journal of heat and mass Transfer 51 (2008) 1325-1331.

Jin Fang and Laurent Pilon, Scaling laws for thermal conductivity of crystalline nanoporous silicon based on molecular dynamics simulations, Journal of Applied Physics 110, 064305 (2011).

John B. Butt, Thermal Conductivity of Porous Catalyst, A.I.Ch.E. Journal, Jan. 1965, vol. 11, No. 1, p. 106-112.

* cited by examiner

SUBSTRATE FOR USE IN PREPARING SOLAR CELLS

CROSS-REFERENCE TO RELATED APPLICATIONS

This application claims the benefit of U.S. Provisional Patent Application No. 61/509,618, filed on Jul. 20, 2011, which is incorporated herein in its entirety by reference.

STATEMENT REGARDING FEDERALLY SPONSORED RESEARCH OR DEVELOPMENT

Not Applicable

BACKGROUND OF THE INVENTION

1. Field of Invention

The present invention relates to methods and processes for fabricating photoelectric devices, and more particularly to methods and processes for fabricating the back face substrate for silicon wafer solar cells.

2. Description of the Related Art

In most current embodiments of solar cell technology, a solar cell comprises a silicon wafer built on a substrate (the "back face substrate"). In this respect, a silicon wafer solar cell closely resembles other silicon wafer semiconductor devices. Accordingly, certain methods and technologies used to fabricate silicon wafers for use in conventional semiconductor devices are also used to fabricate silicon wafers for solar cells. However, the choice of materials for the back face substrate of a solar cell hinges upon different criteria than the choice of substrate material for the back face substrate of a conventional semiconductor device. For example, when fabricating a silicon wafer with a back face substrate for a conventional semiconductor device, as for example for use in an integrated circuit, it is usually desirable for the substrate material to be an electrical insulator. By contrast, with a solar cell, it is desirable for the back face substrate to be an electrical conductor. Thus, the back face substrate of a solar cell is often referred to as a "back face conductor".

In order to improve silicon utilization and reduce the material costs of producing silicon wafer solar cells, the trend in the industry has been to reduce the thickness of silicon wafers as much as is practical. Wafer thickness of between 180 microns and 200 microns is typical of the present state of the technology. Customary silicon wafer specifications at present call for a square-faced wafer that is slightly over 12 millimeters on each side of the square; thus, the length of the wafer, on any side or diagonal, is considerably greater than the thickness of the wafer.

Silicon wafer solar cells are fabricated using processes that require the silicon and the substrate material or materials to attain high temperatures—usually several hundred degrees Celsius, with the exact temperatures varying depending on the type of fabrication process used and the nature of the substrate material, among other considerations. When a silicon wafer solar cell cools after fabrication, the solar cell often will experience bowing due to a difference in the coefficient of thermal expansion (CTE) of the substrate material versus the CTE of the silicon. As the substrate material cools and contracts to a greater degree than the silicon, the contracting substrate material pulls the silicon into a curved or bowed shape. The greater the difference between the CTE of the substrate material and the CTE of silicon, the greater the bowing. Additionally, bowing generally will be greater with thinner wafers, as thinner wafers generally flex more easily than thicker wafers.

Significant bowing can damage a silicon wafer, for example by leading to separation between the silicon layer of the solar cell and the back face substrate, or by causing the silicon wafer to crack. Therefore, it is desirable to limit bowing as much as possible while still producing a thin silicon wafer with a conductive back face substrate. In addition to bowing during the fabrication process, a silicon wafer used as a solar cell may also experience bowing due to changes in temperature during use. Therefore, a silicon wafer solar cell should be designed to minimize bowing due to extremes of summer and winter weather. In particular, a silicon wafer solar cell should be designed to withstand exceptionally low winter temperatures, which may be infrequent but can nevertheless cause failures such as those discussed above when they do occur.

One approach to limiting the degree of bowing in a finished silicon wafer solar cell is to select materials for fabrication of the solar cell which decrease as much as is feasible the mismatch between the CTE of the silicon layer and the CTE of the back face substrate. With conventional semiconductor devices, practitioners have used for the back face substrate various ceramic materials that have a CTE close to the CTE of silicon. However, this class of substrate materials is generally ill-suited for use in a solar cell because the ceramic materials with a low CTE close to the CTE of silicon are generally insulators and are poor electrical conductors. As discussed above, with a solar cell, it is desirable for the back face substrate to be an electrical conductor.

As electrical conductors, the metals shown in the Table 1 as follows make attractive candidates for use as conductive back face substrates:

TABLE 1

MATERIALS, COEFFICIENTS OF THERMAL EXPANSION, AND MELTING POINTS

| Material | CTE (PPM per ° C.) | Melting Point (° C.) |
| --- | --- | --- |
| Silicon (Si) | 3 | 1414 |
| Platinum (Pt) | 9 | 1770 |
| Gold (Au) | 14 | 1063 |
| Copper (Cu) | 17 | 1084 |
| Silver (Ag) | 18 | 961 |
| Aluminum (Al) | 23 | 660 |

However, essentially all of the candidate metals have a high mismatch of CTE as compared to silicon. Gold and platinum have high melting points and would present high material costs for use in silicon wafers. Copper likewise has a high melting point. Silver has a slightly lower melting point, but silver's lack of elongation and relatively high cost also make it impractical to use as a substrate material for a conducting back face substrate. Aluminum is attractive as a material for a conductive back face, as it has a low melting point and is a good electrical conductor. However, Aluminum by itself as a substrate presents the possibility of significant bowing because of the great difference in CTE between silicon (which is approximately 3 parts per million per degree Celsius) and aluminum (which is approximately 23 parts per million per degree Celsius).

In light of the above, it is desirable for the back face conductor of a solar cell to be highly conductive electrically. It is also desirable for the back face conductor to be highly reflective in the ultraviolet (UV) to infrared (IR) range of the electromagnetic spectrum. A back face conductor is desired which is able to survive and operate in a wide range of thermal conditions, including cold winter conditions and summer heat. Additionally, for solar cells to be competitive with technological alternatives, it is desirable to produce a solar cell using materials for the back face conductor which are not prohibitively expensive.

BRIEF SUMMARY OF THE INVENTION

Disclosed herein are methods and processes for fabricating photoelectric devices and more particularly to methods and processes for fabricating a conductive back face substrate for silicon wafer solar cells. In many embodiments of the present invention, a conductive material, such as aluminum, is combined with other substances having lower CTE to form a composite material for use as a back face substrate. This composite material takes advantage of the high conductivity of aluminum, while the other substances reduce the overall CTE of the composite material and thereby diminish the adverse effects of bowing from CTE mismatch. In at least one embodiment of the present invention, a conductive composite substrate material is fabricated by mixing particulate aluminum with a particulate additive comprising a mineral, ceramic, or other small particulate with a low CTE, and casting and firing the mixture so that the aluminum forms a continuous phase that will be electrically conductive, and the additive forms a discontinuous phase that will control and match the CTE of the mixture to be equal to or close to that of silicon. In several embodiments, the additive is a material with a high temperature melting point, a small particle size, and a low CTE. In several embodiments, the additive is co-milled with or mixed into a fine aluminum powder in order to make a castable or shapeable precursor or body, which can be shaped into a back face substrate, wherein the low CTE particles become the discontinuous phase in the back face substrate. This body is then fired to the melting point of aluminum, at which point, upon solidification, the additive particles, which are very strong in compression, are put into compression as the aluminum seeks to shrink, causing the aluminum to build up tensile stresses which are relieved by elongation. In several embodiments, by tailoring the distribution of particle sizes and amount of volume filled with the low CTE particles, a conductive aluminum-based back face substrate member is made having a tailored CTE essentially close to that of silicon.

BRIEF DESCRIPTION OF THE SEVERAL VIEWS OF THE DRAWINGS

These and additional features and embodiments of the present general inventive concept will become more clearly understood from the following detailed description read in conjunction with the accompanying drawings, in which.

DETAILED DESCRIPTION OF THE INVENTION

Disclosed herein are methods and processes for fabricating photoelectric devices, and more particularly, methods and processes for fabricating a back face substrate for a silicon wafer solar cell. In several embodiments, the methods and processes of the present general inventive concept provide for the manufacture of a back face substrate for a silicon wafer solar cell having a relatively high conductivity, and also having a relatively low CTE. According to several features of the present general inventive concept, a back face substrate is provided which includes a finely divided particulate additive bonded in a continuous phase of conductive material, the particulate additive imparting a low CTE to the back face substrate while the continuous phase of conductive material maintains conductivity of the back face substrate. In many embodiments of the present invention, a continuous phase of the back face substrate is provided which comprises aluminum or other such conductive material, and is combined with a discontinuous phase comprising at least one of other substances having a lower CTE than the continuous phase, such that a composite substrate material is formed for use as a back face substrate. This composite substrate material takes advantage of the high conductivity of the aluminum continuous phase, while the discontinuous phase comprising other substances reduces the overall CTE of the composite material, thereby diminishing the adverse effects of bowing from CTE-mismatch.

According to one embodiment of a method of manufacture of the present general inventive concept, a conductive composite substrate material is fabricated by first mixing a measure of first particulate material comprising a conductive material with a measure of second particulate material comprising a mineral, ceramic or other small particulate having a low CTE. The mixture is then cast to a desired shape, and thereafter is heated such that a composite material is formed having a continuous phase that is electrically conductive, and a discontinuous phase imposing a low overall CTE to the composite material that is equal to, or close to, that of silicon.

Figure 1:
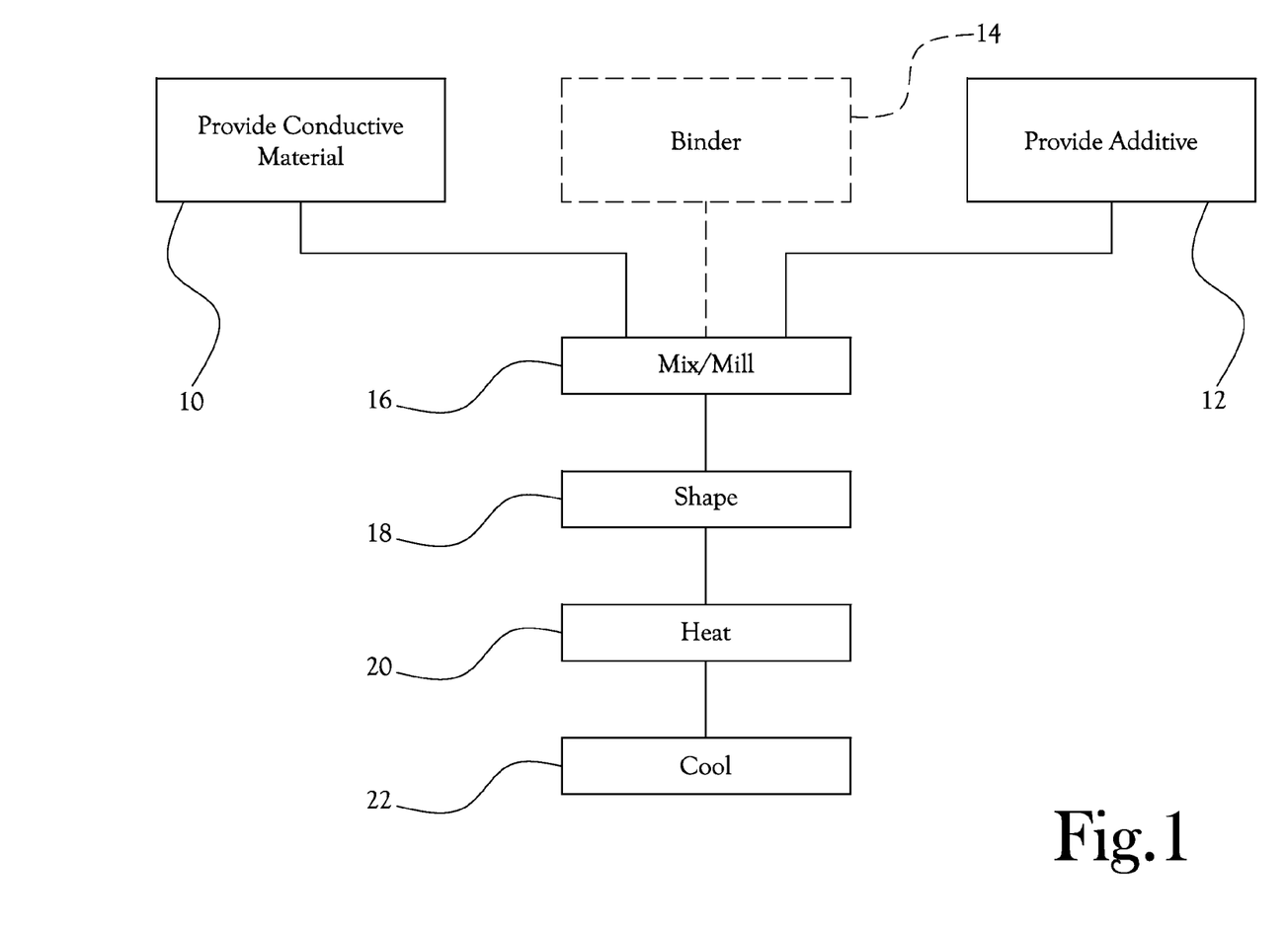
FIG. 1 is a flow chart illustrating one embodiment of a method for producing a back face substrate useful in constructing a silicon wafer solar cell according to an example embodiment of the present general inventive concept.

FIG. 1 illustrates a flow diagram of a method of manufacture in accordance to one embodiment of the present general inventive concept. As illustrated in FIG. 1, in one embodiment, a conductive material is provided 10 for use as the continuous phase of a conductive composite substrate material, and an additive material is provided 12 for use as the discontinuous phase of the conductive composite substrate material. The conductive material is preferably a metal having sufficiently high conductivity such that the resultant continuous phase of the conductive composite substrate material, as will be further discussed below, exhibits an overall conductivity sufficiently high to enable use of the conductive composite substrate material as a back face substrate of a solar cell. Generally, the additive is a material with a high temperature melting point, which is strong in compression, and which has a CTE approximately equal to, or close to, the CTE of silicon. In certain embodiments, the conductive material is selected from the group consisting of platinum, gold, copper, silver, and aluminum, and in a preferred embodiment, is aluminum. In one embodiment, the additive material is silica.

It is desired that both the conductive material and the additive be of a generally fine particle size, such that following provision 10, 12 of the conductive material and the additive, the conductive material and additive may be combined 16 to form a mixture of fine-grained conductive material and additive. In certain embodiments, provision 10, 12 of the conductive material and the additive includes provision of materials which are of a small average particle size. In other embodiments, following provision 10, 12 of the conductive material and the additive, the conductive material and/or additive are milled to a desired average particle size. It will be understood that such milling of the conductive material and/or additive may occur in an operation separate from the operation of combining 16 the conductive material and the additive, or as part of the same operation. For example, as illustrated in FIG. 1, following provision 10, 12 of the conductive material and the additive, the conductive material and additive are combined with an optional binder 14 which, in certain embodiments, is selected to promote adherence of the conductive material and the additive, and also to limit oxidation of the conductive material and/or the additive. Thereafter, the conductive material, additive, and binder are milled together 16, such that the collective particle size distribution of the conductive material, additive, and binder is reduced, thereby forming a particulate mixture of the conductive material, additive, and binder.

In one embodiment, the method of the present general inventive concept begins with provision 10 of a conductive material defined by a measure of granular aluminum, such as commercially available aluminum powder or flake, having an average particle size of less than 10 microns, and provision 12 of an additive defined by a measure of fused silica powder having an average particle size of approximately 5 microns. The silica powder and the granular aluminum are co-milled 16 with a binder 14 which can later be removed from the mixture of silica and aluminum absent significant oxidation of the aluminum. In one embodiment, the fused silica is at least 99.5% pure, such as is commercially manufactured and sold by Minco, Inc., C-E Minerals, Inc., or Precision Electro Minerals Co. (PEMCO), Inc., and has a CTE of approximately 0.59 parts per million per degree Centigrade (PPM) and a melting point close to 1800 degrees Centigrade. In several embodiments, the ratio of silica to aluminum in the milled composite substrate material ranges from 30% to 84%.

Following the operation(s) of milling and mixing 16 the conductive material, the additive, and optionally the binder, the resultant composite mixture is shaped 18 into a desired shape, such as for example a flat, planar member shape desirable for use as a back face substrate in a solar cell. In several embodiments, such shaping 18 is accomplished by setting the composite substrate material into a boat or other such mold which maintains and retains the desired shape of the mixture. In several embodiments, the boat is fabricated from a material which maintains the desired shape of the mixture during subsequent heating 20 of the boat and mixture, as described below, which is not reactive with the components of the mixture, and which also allows release of the finished substrate following heating 20. For example, in some embodiments, the boat is fabricated from boron nitride, and in other embodiments, from a mixture of boron nitride and titanium diboride, of the type commonly used as evaporation boats for chemical vapor deposition of aluminum. It will be recognized that such a boat may be capable of making many thousands to tens of thousands or more substrates and is not reactive with the aluminum of the mixture.

Figure 2:
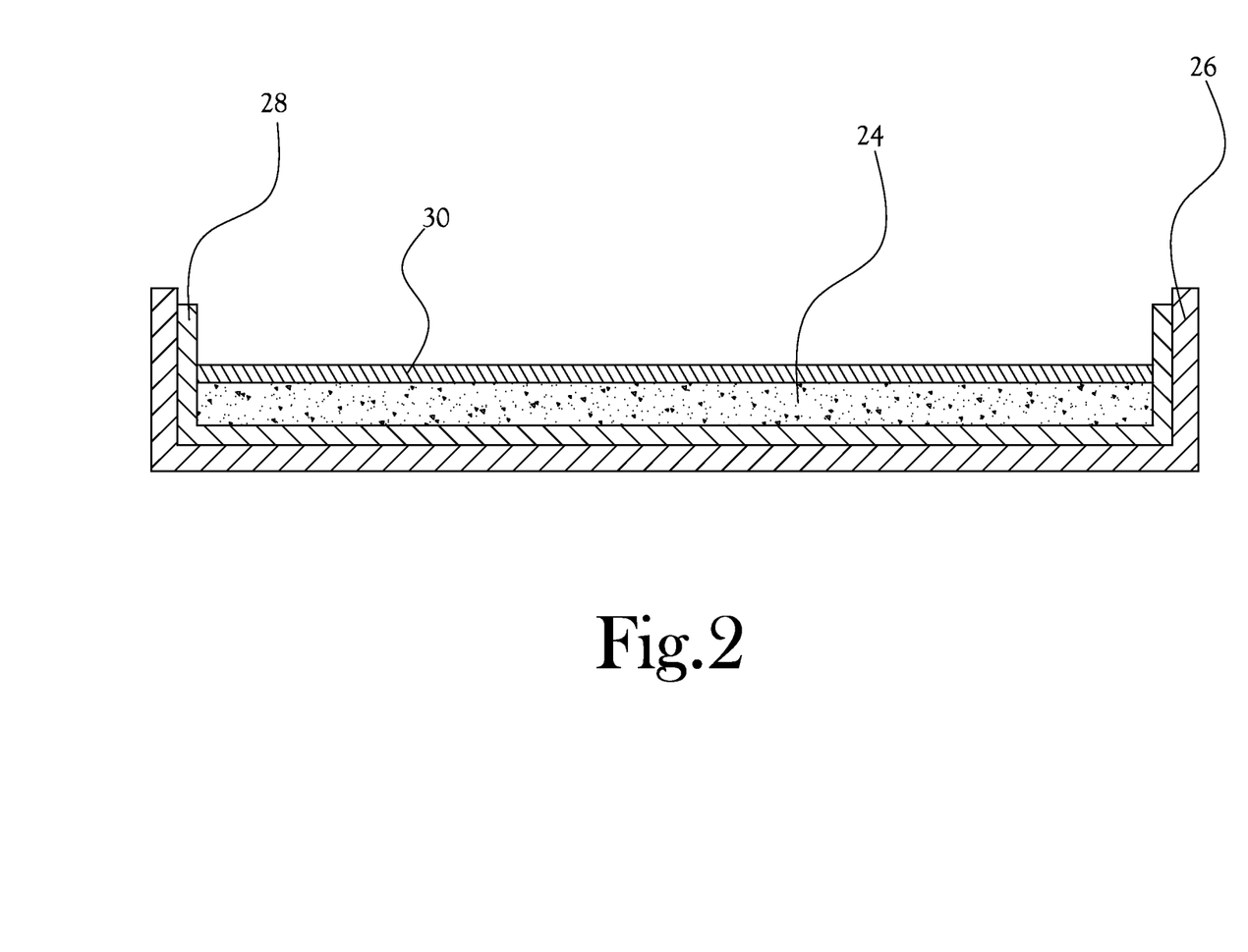
FIG. 2 is a cross-sectional side view illustrating a composite mixture layer set in a boat for heating in accordance with one embodiment of the present general inventive concept.

FIG. 2 illustrates a cross-sectional side view of a composite mixture layer 24 set in a boat 26 for heating in accordance with one embodiment of the present general inventive concept. In some embodiments, a foil or coating of the conductive material 28 is applied to the surface of the boat 26 before heating is performed, thereby interposing a relatively pure conductive material interlayer 28 between the boat 26 and the substrate material layer 24. Additionally, in some embodiments, a coating of boron 30 is provided along a top surface of the substrate material layer 24 so as to improve the interface and doping mechanics and metrics of the finished substrate material layer 24. Referring to FIGS. 1 and 2, following shaping 18 of the composite mixture, such as by placement of a composite mixture layer 24 into the boat 26, the composite mixture is heated 20 at least to the melting point of the conductive material. For example, in an embodiment in which the conductive material is aluminum, the composite mixture is heated 20 to at least the melting point of aluminum, which is approximately 660 degrees Centigrade at standard pressure.

Figure 3:
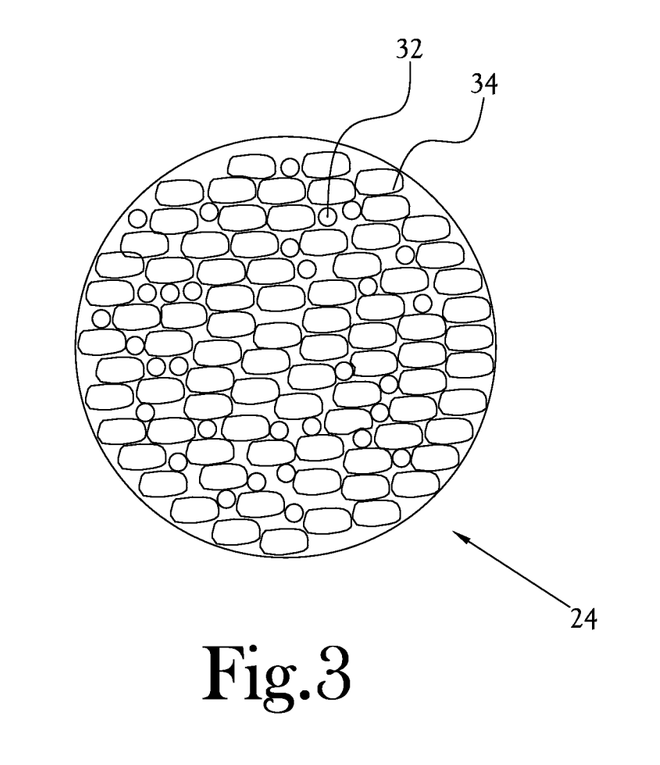
FIG. 3 is a schematic diagram illustrating a close-up view of a composite mixture prepared in accordance with an example embodiment of the present general inventive concept.
Figure 4:
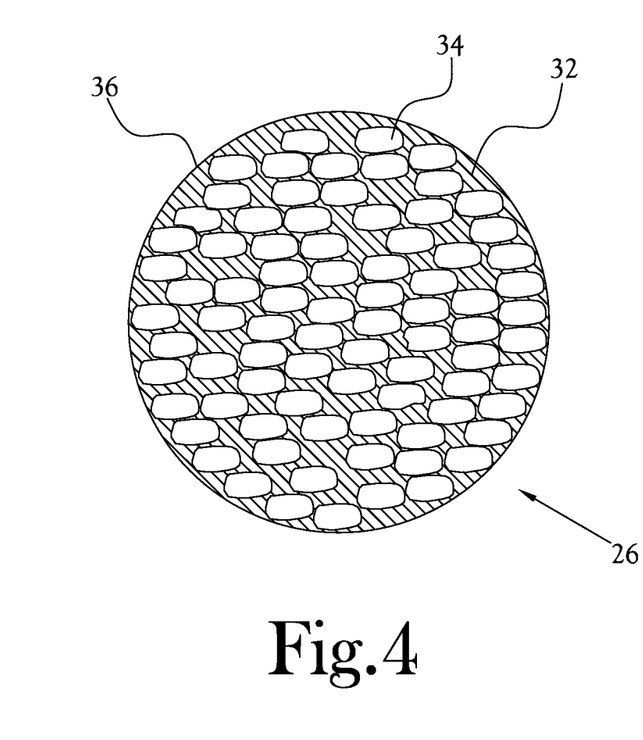
FIG. 4 is a schematic diagram illustrating a close-up view of a back face substrate prepared in accordance with an example embodiment of the present general inventive concept.

FIGS. 3 and 4 are schematic diagrams showing close-up views of the composite mixture 24 prior to (FIG. 3) and after (FIG. 4) the operation of heating the mixture 20 discussed above. It will be understood that FIGS. 3 and 4 are merely schematic diagrams, and that the relative shapes and diameters of the various conductive material particles and additive particles are not depicted to scale. As shown in FIG. 3, the above-discussed milling/mixing 16 of the conductive material with the additive results in a distribution of additive particles 34 throughout the conductive material particles 32. As shown in FIG. 4, once the mixture 24 is heated to at least the melting point of the conductive material 32, the conductive material 32 forms a continuous liquid matrix 36 having additive particles 34 suspended therein. In several embodiments, the ratio of additive particles 34 to conductive material particles 32 is such that, following heating 20 of the mixture 24, the additive particles 34 maintain intimate contact with one another, such that at least a portion of the weight of each additive particle 34 may bear upon at least one adjacent additive particle 34. However, it will be recognized that such intimate contact of the additive particles 34 is not necessary to accomplish the present general inventive concept. Furthermore, it will be recognized that the specific ratio of additive particles 34 to conductive material 32 necessary to accomplish such intimate contact may vary, at least in part, upon the specific particle size distribution and particle shapes defined by the various particles of conductive material 32 and additive 34.

Referring now to FIGS. 1 and 4, following the heating process 20, the composite substrate material 24 is cooled 22. It will be understood that such cooling 22 of the composite substrate material 24 may be by active means, or by passively allowing the composite substrate material 24 to cool. It will be understood that, as the conductive material 32 cools 22, the melting and resolidification of the conductive material 32 produces a continuous, electrically-conductive phase 36 surrounding the additive particles 34. As the mixture cools to below the melting point of the conductive material 32 and begins to solidify, the conductive material 32 begins to thermally contract, putting the various additive particles 34 into compression and stretching the conductive material 32 around the additive particles 34. However, the discontinuous phase of additive particles 34 interspersed among the continuous phase of conductive material 32 resists thermal contraction of the composite substrate material 24. Accordingly, tensile stresses within the continuous phase of conductive material 32 are relieved by elongation. Thus, the overall thermal contraction of the composite substrate material 24 is controlled by the additive particles 34, and the composite substrate material 24 exhibits an effective overall CTE of the composite substrate material 24 which is approximately equal to that of the additive material, in other words, approximately equal to, or close to, that of silicon. By tailoring the distribution of particle sizes and amount of volume filled with the low CTE particles, a conductive back face substrate member with a tailored CTE essentially close to that of silicon is produced.

Figure 5:
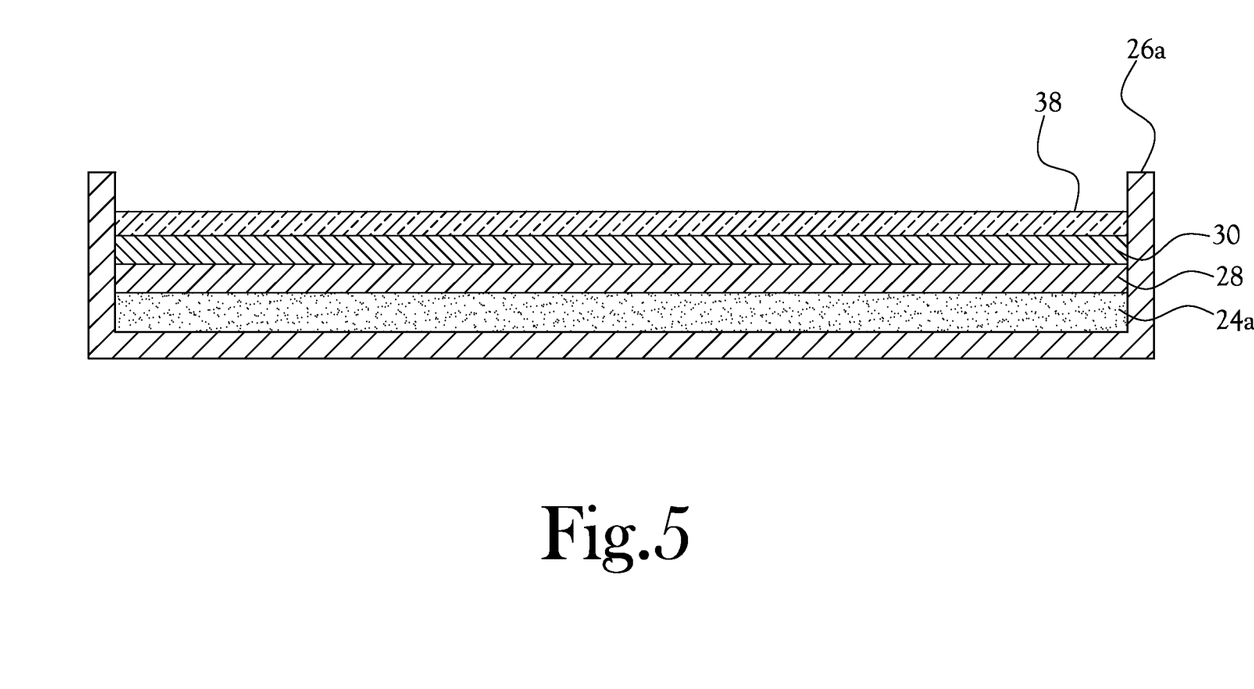
FIG. 5 is a cross-sectional side view illustrating a composite mixture layer set in a boat for heating in accordance with another embodiment of the present general inventive concept.

In several embodiments of the present general inventive concept, such as the embodiment of FIG. 2, the substrate 24 is manufactured initially, and may later be used as a component for the manufacture of a solar-grade silicon wafer in situ on the substrate 24. In other embodiments, manufacture of the substrate 24 is performed simultaneously with manufacture of a solar cell. For example, FIG. 5 illustrates a cross-sectional side view of a composite mixture layer 24a set in a boat 26a for heating in accordance with another embodiment of the present general inventive concept, in which a solar cell is manufactured simultaneously with the manufacture of the substrate layer 24a. In the illustrated embodiment of FIG. 5, once the above-discussed operations of forming a composite mixture 24 of conductive material particulates 32 and additive particulates 34, a layer of composite mixture 24a is deposited into a boat 26a which defines an internal cavity having the size and shape desired for shaping a finished solar cell. A conductive material interlayer 28 is provided along a top surface of the layer of composite mixture 24a, and a layer of boron dopant 30 is provided above the conductive material interlayer 28. A silicon layer 38 is provided above the dopant layer 30 and the underlying conductive material interlayer 28 and composite mixture layer 24a. Thereafter, the contents of the boat 26a are heated 20 as discussed above to form the substrate 24 having the above-discussed continuous phase of conductive material 32 and discontinuous phase of additive material 34.

Once the contents of the boat 26a are heated 20 to above the melting point of the conductive material, the conductive material interlayer 28 melts and, in certain embodiments, fuses with the adjacent conductive material forming the composite substrate 24. Thus, a composite substrate 24 is formed which includes an external layer of pure conductive material in contact with the adjacent layers 30, 38 of the solar cell. It will be recognized that, in embodiments in which the conductive material 32 is aluminum, during subsequent cooling 22 of the composite substrate material 24 as described above, the conductive material interlayer 28, which in several embodiments is constructed to be very thin, such as for example having a thickness of only a few thousandths of an inch, tends to thermally contract at a rate of approximately 24 PPM, i.e., the CTE of aluminum itself. However, as discussed above, the composite substrate material 24 to which the conductive material interlayer 28 is fused tends to thermally contract at a collective rate much lower than that of the conductive material interlayer 28, such as for example approximately 3 PPM in certain embodiments. In the embodiment of FIG. 5, the conductive material interlayer 28 is further restrained along a surface of the conductive material interlayer 28 opposite the composite substrate material 24a, by virtue of lamination with the dopant layer 30 and/or the silicon layer 38. Thus, the interface of the composite substrate material 24a with the silicon layer 38 and associated dopant layer 30 serves to limit the ability of the conductive material interlayer 28 to impart a bowing strain to the silicon layer 38, thereby leaving the silicon layer 38 essentially strain and stress free, both at standard temperature and pressure and at significantly higher and lower temperatures.

Several additional benefits resulting from the above-described general inventive concept will be recognized by one of skill in the art. For example, in the event a substrate 24 is produced in which several fused silica particles 34 are present at the reflective interface of the substrate 24 and the silicon 38, since the fused silica 34 is transparent in the spectrum of interest, those photons with marginal band gap energy may, in certain instances, be reflected back into the body of the silicon 38 by the fused silica 34. In the case where those photons with marginal band gap energy impact and are transmitted through a particle of fused silica 34, such photons may, in certain instances, be reflected at an angle created by the refractive interface of the substrate 24a and the silicon 38, thus creating a reflectance angle with a longer path through the silicon 38, and thereby increasing the probability that the photon may be captured by the solar cell. Furthermore, the above-described general inventive concept allows the possibility for construction and utilization of a very thin solar-grade silicon wafer in a solar cell, such as for example 50 microns or less. Utilization of such a very thin solar-grade silicon wafer will lower costs of silicon per watt produced by the solar cell by decreasing silicon usage and increasing output. Also, it will be recognized that the above-discussed general inventive concept makes possible the construction of solar cells that are capable of withstanding extreme hot and cold environments, a limiting factor today and one which will make solar modules much more reliable in all environments.

It will be recognized that, in other embodiments, the composite substrate material 24 may comprise aluminum milled with other materials used to affect the CTE of the composite substrate material or to affect other properties of the final back face substrate layer. In some embodiments, these other materials that are included in the composite substrate material 24 include, for example, silver, copper, germanium, gallium, gallium arsenide, and a number of alloys and ceramic materials. In some embodiments, these other materials that are included in the composite substrate material include particulate or granular silver, particulate or granular copper, particulate or granular germanium, particulate or granular gallium, or particulate or granular gallium arsenide. Persons of skill in the art will recognize that various combinations of these materials are possible and are contemplated by the present general inventive concept.

While the present invention has been illustrated by description of several embodiments and while the illustrative embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept.

Having thus described the aforementioned invention, I claim:

1. A method for fabricating a back face substrate useful in constructing a silicon wafer solar cell, the method comprising:

mixing a granular aluminum component with a granular silica component to form a composite mixture;

shaping the composite mixture to a desired shape of the back face substrate;
melting the granular aluminum; and
allowing the melted aluminum to cool;
whereby melting of the granular aluminum results in the formation of a back face substrate having a continuous phase of aluminum throughout a discontinuous phase of granular silica.

2. The method of claim 1, said mixing operation further including milling a measure of aluminum with a measure of silica to produce the granular aluminum and the granular silica.

3. The method of claim 1, said mixing operation further including mixing a binder component with the granular aluminum component and the granular silica component.

4. The method of claim 3, wherein the binder limits oxidation of at least one of the granular aluminum and the granular silica.

5. The method of claim 1 wherein said granular aluminum has an average particle size of approximately 10 microns or less.

6. The method of claim 1 wherein said granular silica has an average particle size of approximately 5 microns or less.

7. The method of claim 1, said shaping operation further comprising:
depositing a measure of the composite mixture into an interior cavity of a boat, the interior cavity defining the desired shape; and
forming the measure of composite mixture to the interior cavity.

8. The method of claim 7 wherein the desired shape is of a planar member.

9. The method of claim 7 wherein said boat is fabricated from at least one material selected from the group consisting of boron nitride and titanium diboride.

10. The method of claim 1, said mixing operation further including mixing a component selected from the group consisting of silver, copper, germanium, gallium, and gallium arsenide with the granular aluminum and the granular silica.

11. The method of claim 1 wherein the ratio of granular silica to granular aluminum in the composite mixture is within the range of 30% to 84%.

12. The method of claim 1, wherein the ratio of granular silica to granular aluminum in the composite mixture is such that the granular silica grains forming the discontinuous phase in the back face substrate maintain intimate contact with one another following the operation of allowing the melted aluminum to cool.

13. The method of claim 1, wherein the discontinuous phase of granular silica serves to limit the thermal contraction of the back face substrate during said operation of allowing the melted aluminum to cool.

14. A method for fabricating a back face substrate useful in constructing a silicon wafer solar cell, the method comprising:
milling a measure of aluminum, a measure of silica, a measure of binder, and a measure of a component selected from the group consisting of silver, copper, germanium, gallium, and gallium arsenide to produce a composite mixture comprising granular aluminum having an average particle size less than or equal to approximately 10 microns and granular silica having an average particle size less than or equal to approximately 5 microns;
shaping the composite mixture to a planar shape by depositing a measure of the composite mixture into an interior cavity of a boat fabricated from boron nitride, the interior cavity defining the planar shape, and forming the measure of composite mixture to the interior cavity;
melting the granular aluminum, thereby allowing the melted aluminum to form a continuous phase through the granular silica; and
allowing the melted aluminum to cool;
whereby melting of the granular aluminum results in the formation of a back face substrate having a continuous phase of aluminum throughout a discontinuous phase of granular silica.

15. The method of claim 14 wherein the ratio of granular silica to granular aluminum in the composite mixture is within the range of 30% to 84%.

16. The method of claim 14, wherein the ratio of granular silica to granular aluminum in the composite mixture is such that the granular silica grains forming the discontinuous phase in the back face substrate maintain intimate contact with one another following the operation of allowing the melted aluminum to cool.

17. The method of claim 14, wherein the discontinuous phase of granular silica serves to limit the thermal contraction of the back face substrate during said operation of allowing the melted aluminum to cool.

18. A method for fabricating a back face substrate useful in constructing a silicon wafer solar cell, the method comprising:
milling a measure of aluminum and a measure of silica to produce a composite mixture comprising granular aluminum and granular silica;
depositing a layer of the composite mixture into an interior cavity of a boat, the interior cavity defining a flat shape;
depositing a layer of aluminum along a top surface of the composite mixture layer;
depositing a layer of silicon along the layer of aluminum opposite the composite mixture layer;
melting the aluminum comprising the aluminum layer and the composite mixture layer, thereby allowing the melted aluminum to form a continuous phase through the granular silica; and
allowing the melted aluminum to cool to form the substrate, thereby bonding the substrate to the silicon layer;
whereby melting of the granular aluminum results in the formation of a back face substrate having a continuous phase of aluminum throughout a discontinuous phase of granular silica, wherein the discontinuous phase of granular silica serves to limit the thermal contraction of the back face substrate during said operation of allowing the melted aluminum to cool.

19. The method of claim 18 further including the operation of depositing a layer of dopant material between the aluminum layer and the silicon layer, the dopant material comprising boron.

20. The method of claim 18, wherein the ratio of granular silica to granular aluminum in the composite mixture is such that the granular silica grains forming the discontinuous phase in the back face substrate maintain intimate contact with one another following the operation of allowing the melted aluminum to cool.

* * * * *